United States Patent [19]
Lofter et al.

[11] Patent Number: 5,739,727
[45] Date of Patent: Apr. 14, 1998

[54] SAMPLED PHASE LOCKED LOOP BEING LOCKED WITH SUPPORT FROM ANOTHER PHASE LOCKED LOOP

[75] Inventors: Björn Ove Lofter, Mölndal; Glenn Axel Sjöberg, Göteborg, both of Sweden

[73] Assignee: Telefonaktiebolaget LM Ericsson, Stockholm, Sweden

[21] Appl. No.: 725,493

[22] Filed: Oct. 4, 1996

[30] Foreign Application Priority Data

Oct. 5, 1995 [SE] Sweden ................. 9503450

[51] Int. Cl.$^6$ ............ H03L 7/087; H03L 7/091; H03L 7/23
[52] U.S. Cl. ............... 331/11; 331/14; 331/17; 331/25
[58] Field of Search ............... 331/10, 11, 12, 331/14, 25, 17

[56] References Cited

U.S. PATENT DOCUMENTS

| | | | |
|---|---|---|---|
| 3,660,781 | 5/1972 | Tewksbury et al. | 331/1 A |
| 4,459,560 | 7/1984 | Kurihara | 331/2 |
| 4,864,252 | 9/1989 | Heck | 331/1 A |
| 5,424,687 | 6/1995 | Fukuda | 331/11 |

FOREIGN PATENT DOCUMENTS

| | | |
|---|---|---|
| 0094837 | 11/1983 | European Pat. Off. . |
| 0 509 706 | 10/1992 | European Pat. Off. . |
| WO 91/07821 | 5/1991 | WIPO . |

OTHER PUBLICATIONS

Japanese Patent Abstract, vol. 12, No. 225, E–626, JP, A, 63–20918 (NEC Corp), 28 Jan. 1988 (Jan. 28, 1988).

*Primary Examiner*—Siegfried H. Grimm
*Attorney, Agent, or Firm*—Burns, Doane, Swecker & Mathis, L.L.P.

[57] ABSTRACT

A sampled phase locked loop is phase-locked with support from a conventional phase locked loop (PLL). The support value from the PLL is locked with the aid of a sample and hold circuit. The locked support value is summed together with the control signal from the sampled loop in order to control a controlled oscillator which can suitably be a voltage-controlled oscillator. Accuracy of the support values depend on the PLL's resolution. The sampled loop is coupled in without any signal being built up in the sampled loop's loop filter.

26 Claims, 4 Drawing Sheets

SAMPLED PHASE LOCKED LOOP BEING LOCKED WITH SUPPORT FROM ANOTHER PHASE LOCKED LOOP

BACKGROUND

The present invention relates to a method and a device for phase-locking a controlled oscillator, for example a voltage-controlled oscillator, to a reference oscillator's signal.

Oscillator devices for generating different frequencies are in many cases constituted by voltage-controlled oscillators (VCO—Voltage Controlled Oscillators), the output signal of which is locked (frozen) to a reference signal by means of a phase locked loop (PLL—Phase Locked Loop). Phase locked loops are used to an ever increasing amount in signal processing and various digital systems. FM demodulation, FSK demodulation, sound encoding, frequency multiplication, data synchronisation and frequency synthesis are just some of many application areas of a phase locked loop.

Phase locked loops in oscillator devices for frequency synthesis have many uses, for example as local oscillators for radio communication equipment. One of the advantages of using an oscillator device with a phase locked loop is that different frequencies can easily be generated from the same oscillator device. By means of the phase locked loop it is comparatively simple to lock the voltage-controlled oscillator's frequency to whole number multiples of the reference signal's frequency. This is achieved most easily with a divider in the loop, which frequency-divides the output signal from the voltage-controlled oscillator with an arbitrary whole number. The result of the division is fed to a phase comparator which compares the resulting phase with the phase of the reference oscillator to thereby produce a control signal to the voltage-controlled oscillator.

There are a large number of digital circuits of the PLL type on the market which, apart from their division and phase detector functions, also include a discriminator function which controls the VCO when the phase detector's difference-frequency lies outside the loop bandwidth. This means that the frequency-locking/phase-locking of a VCO can occur within a large frequency range.

One of the disadvantages of digital PLL-circuits is that phase noise (jitter) is generated in the loop via the digital circuits. Another disadvantage is that the amplification of the phase detector signal has to be very high in order to compensate for the VCO's frequency division up to the phase detector. In the case where the division is by 100, a frequency error of 100 Hz will only be 1 Hz in the phase comparator. The difference in the frequency of 1 Hz should then generate a phase detector signal which corrects the VCO a 100 Hz and therefore it requires an amplification. The necessary amplification also amplifies undesirable noise of different types.

One type of phase locked loop which is asserted as eliminating the above-mentioned disadvantages is a sampled phase locked loop (SPLL—Sampled Phase Locked Loop). In the sampled loop, the VCO's envelope is directly sampled in the phase detector. The VCO can phase-lock to all multiples of the reference frequency, provided that the VCO is controlled so that the difference frequency coming out of the phase detector lies within the loop bandwidth.

The sampled phase detector has no discriminator part. This means that too large a difference in frequency between a multiple of the reference oscillator's frequency and the VCO's frequency will make the loop unable to phase-lock.

In order to minimize the difference frequency and in order to set the frequency that is desired, a support voltage to the VCO is normally pre-set from a memory. The memory thus has to contain support voltages for all selectable frequencies. The voltages have to be measured individually for each manufactured oscillator device and moreover have to be continually updated depending upon, inter alia, the VCO's temperature dependence and ageing. With small frequency steps, the voltages are close and it is then difficult to generate support voltages with sufficient accuracy. Error-locking on neighboring channels or on spurious signals are commonplace.

In attempting to solve the problems of using sampled loops, the conclusion has been drawn that a conventional phase locked loop can be used to ensure that the voltage-controlled oscillator oscillates at the desired frequency. When the desired frequency is reached and the conventional phase-locked loop has phase-locked, the control of the voltage-controlled oscillator is coupled-over to the sampled loop. This type of device is described U.S. Pat. No. 3,660,781 but can be viewed as having a number of disadvantages. Amongst other things, the control signal to the voltage-controlled oscillator has to be built up in the sampled loop when it is coupled in. In order to obtain an acceptable build-up/transient time, the control voltage filter has to be fast, which implies a poorer control loop.

SUMMARY

An object of the present invention is to provide a method and a device which can lock a sampled loop to an arbitrary multiple of a reference oscillator's frequency.

Another object of the invention is to provide a method and a device enabling the obtaining of a short and optimum locking-in time upon frequency changes, and optimum phase-noise characteristics in a phase-locked sampled loop.

A further object of the invention is to provide a method and a device for frequency generation which comprises at least two loops, where one of these is a sampled phase-locked loop and where no voltage has to be supplied via the sampled loop's loop filter when the sampled loop takes over.

An additional object of the present invention is to provide a method and a device for frequency generation which is less sensitive to variations, such as for example temperature variations, air pressure variations, air humidity variations and variations caused by ageing.

A still further object of the invention is to provide a method and a device for frequency generation which can be easily calibrated in a manufacturing sense.

The above objects are achieved in accordance with the invention by a device and a method where a sampled phase-locked loop is phase-locked with support from a conventional phase-locked loop (PLL). The support value from the PLL-loop is locked with the aid of a hold circuit (Sample and Hold circuit—S/H) whereafter the locked support value is summed together with the control signal from the sampled loop in order to control a controlled oscillator, for example a voltage-controlled oscillator. The invention results in the accuracy in the support values/support voltages depending on the resolution of the PLL-circuit and the coupling-in of the sampled loop being able to occur without any signal/voltage being built up in the sampled loop's loop filter.

The aforementioned objects are achieved in accordance with the invention also by an oscillator device (arrangement) which generates an output signal with one predetermined frequency at a time from a number of predetermined frequencies. The oscillator device comprises a first loop, a second loop, a controlled oscillator which is suitably a voltage-controlled oscillator, a switching means, a measuring and storage means, and a summation means. The first loop operates as a sampled phase-locked loop and produces an error signal, upon which a first control signal is dependent. The second loop operates as a phase-locked loop and produces a second control signal. The voltage-controlled oscillator generates the output signal with a frequency which is in relation to the first or second control signal and is a part of the first and the second control loops. The switching means couples the first control signal or the second control signal to the voltage-controlled oscillator. The measuring and storage means measures and holds the voltage value of the second control signal during the setting procedure when the second loop has phase-locked to a predetermined frequency and the measuring and storage means thereby produces a stored control signal. The summation means sums the stored control signal with the error signal and thereby creates the first control signal. The oscillator device couples the second control signal to the voltage-controlled oscillator, by means of the switching means, during the setting procedure and otherwise couples the first control signal to the voltage-controlled oscillator.

The aforementioned objects are also achieved in accordance with the invention by an oscillator device which generates an output signal with one predetermined frequency at a time from a number of predetermined frequencies. The oscillator device is well suited for predetermined frequencies which are within the microwave range or higher frequency ranges and similarly within lower frequency ranges. The oscillator device comprises a first loop, a second loop, a voltage-controlled oscillator, a switching means, a measuring and storage means, and a summation means.

The first loop comprises a reference oscillator, a pulse generator, a first phase comparator and a first signal processing unit. The first loop functions as a sampled phase-locked loop by comparing, in the first phase comparator, the phase of the output signal with a first reference signal's phase position/angle produced by the reference oscillator and the pulse generator, and thereby, after a first signal processing in the first signal processing unit, producing an error signal upon which a first control signal is dependent.

The second loop comprises a frequency divider, a second phase comparator and a second signal processing unit. The second loop determines the output signal's frequency by means of the frequency divider during the setting procedure, by frequency-dividing the output signal in the frequency divider and comparing its phase in a phase comparator with a second reference signal's phase position produced by a reference oscillator and thereby produces a second control signal after a second signal processing in the second signal processing unit.

If the output signal's predetermined frequencies are very high, in the microwave range or higher, it may be suitable if the oscillator device comprises a frequency conversion means which frequency-converts the output signal before it is frequency-divided in the second loop in order that the frequency of the output signal falls within the frequency range of the second loop. The frequency conversion means suitably comprises a frequency divider means or a reference-frequency means and a mixer means.

The signal processing unit in the first loop suitably comprises an amplifier and a loop filter. The second signal processing unit in the second loop also suitably comprises an amplifier and a loop filter. The loop filter should include a low-pass function which can be complemented with other filter functions (bandpass). It is also advantageous if the loop filter in the first signal processing unit is slower than the loop filter in the second signal processing unit. "Slower" should be interpreted as narrower bandwidth and therefore a longer build-up/transient time.

The voltage controlled oscillator generates the output signal with a frequency which is in relation to the first or second control signal and is a part of the first and the second loop. The switching means couples the first control signal or the second control signal to the voltage-controlled oscillator. The measuring and storage means measures and holds the voltage value of the second control signal during the setting procedure, when the second loop has phase-locked to a predetermined frequency and thereby produces a stored control signal.

The oscillator device also suitably comprises a memory means which stores a number of the voltage values of the second control signal measured during the setting procedure. The values are suitably stored in memory locations which are sorted with regard to the output signal's frequency, to which the value corresponds. The stored control signal can also be produced from stored/saved measured values in this augmented version, in order to thereby allow a fast change of the output signal's frequency without having to go through a setting procedure.

An additional suitable variation is where the memory means also sorts the measured voltage values of the second control signal into memory locations with regard to the temperature of the voltage-controlled oscillator at the time of measuring. In this way, maintenance of a stable and accurate frequency is possible, without having to go through a setting procedure upon temperature variations of the voltage-controlled oscillator.

The memory means can of course be constituted in many different ways. One way is to construct the memory means with the aid of digital memory cells, an analog to digital converter and a digital to analog converter. The measured values of the second control signal are digitally stored here in the digital memory cells after analog to digital conversion in the analog to digital converter. When producing the stored control signal from the stored measured voltage values, the stored measured values undergo digital to analog conversion in the digital to analog converter.

Another way of constructing the memory means is with the aid of analog memory cells. The measured voltage values of the second control signal are stored in analog form and supplied from the analog memory cells upon production of the stored control signal from the stored measured voltage values.

The summation means sums the stored control signal with the error signal in order to produce the first control signal. By means of the switching unit, the oscillator device couples the second control signal to the voltage-controlled oscillator during the setting procedure and otherwise couples the first control signal to the voltage-controlled oscillator.

The aforementioned objects are also achieved in accordance with the present invention by a method for generating an output signal with one predetermined frequency at a time from a number of predetermined frequencies with a controlled oscillator which may suitably be constituted by a voltage-controlled oscillator. The method is suitable even where said predetermined frequencies are within the microwave range or higher, i.e. GHz and upwards in frequency. The generation comprises a number of steps. A first loop is arranged to operate as a sampled phase-locked loop. In the first loop, a reference signal is produced, the output signal's phase is compared with the phase position of the first reference signal, and the result of the comparison is signal processed in a first signal processor which thereby produces an error signal, upon which a first control signal is dependent. The signal processor suitably comprises a filter amongst other things.

A second loop is arranged to operate as a phase-locked loop and the output signal's frequency is determined during the setting procedure by the second loop. In the second loop, a second reference signal is produced, the output signal is divided, the phase of the frequency-divided output signal is compared with the phase position of the second reference signal, and the result of the comparison is signal-processed in a second signal processor, which thereby produces a second control signal. The signal processor suitably comprises a filter amongst other things.

Since both signal processors comprise filters, it is advantageous that the first signal processor's filter is slower than the second signal processor's filter. "Slower" is to be interpreted as narrower bandwidth and therefore a longer build-up time.

During the setting procedure, the second control signal is measured and when the second loop has phase-locked the measured value is stored for being able to be sent on as a stored control signal. The stored control signal is summed with the error signal and the first control signal is produced thereby. The output signal is produced by means of the voltage-controlled oscillator with a frequency which is in relation to the first or the second control signal. The second control signal is coupled to the voltage-controlled oscillator during the setting procedure and otherwise the first control signal is coupled to the voltage-controlled oscillator.

With each setting procedure, the measured value is preferably stored in a memory part of a memory unit, the memory part corresponding to the predetermined frequency of the setting procedure, whereby changing of the output signal's frequency can occur without a setting procedure being coupled-in. Additionally it can sometimes be an advantage that the memory part in which the measured value is stored also corresponds to a temperature. That means that the measured values are put into a matrix for frequency on one axis and temperature on the other. Of course it is possible to augment this with, or make use of, other parameters such as for example air humidity, height and air pressure.

Especially when the output signal's frequency is high, for example when the predetermined frequencies are within the microwave range or higher, i.e. GHz and upwards in frequency, it can be an advantage to frequency-convert the output signal before the output signal is frequency-divided in the second loop. This is so that the output signal's frequency will fall (be) within the frequency range of the second loop, which then does not have to be the same and as high as the first loop's frequency range.

BRIEF DESCRIPTION OF THE DRAWINGS

The invention will now be described in more detail, without in any way being of a limiting nature, with reference to the accompanying drawings, where.

DETAILED DESCRIPTION

In order to facilitate understanding of the invention, an oscillator device with a conventional phase-locked loop and an oscillator device with a conventional sampled phase-locked loop will be described in connection with FIGS. 1 and 2 as a manner of introduction. Firstly however it should be mentioned that there are a large number of different ways to control an oscillator, such as for example with voltage, current or light to mention only a few. The most common way to control an oscillator is with voltage, a voltage-controlled oscillator, and thus the following example is merely explained by using voltage-controlled oscillators and is not to be seen as a limitation to only this type of controlled oscillator.

Figure 1:
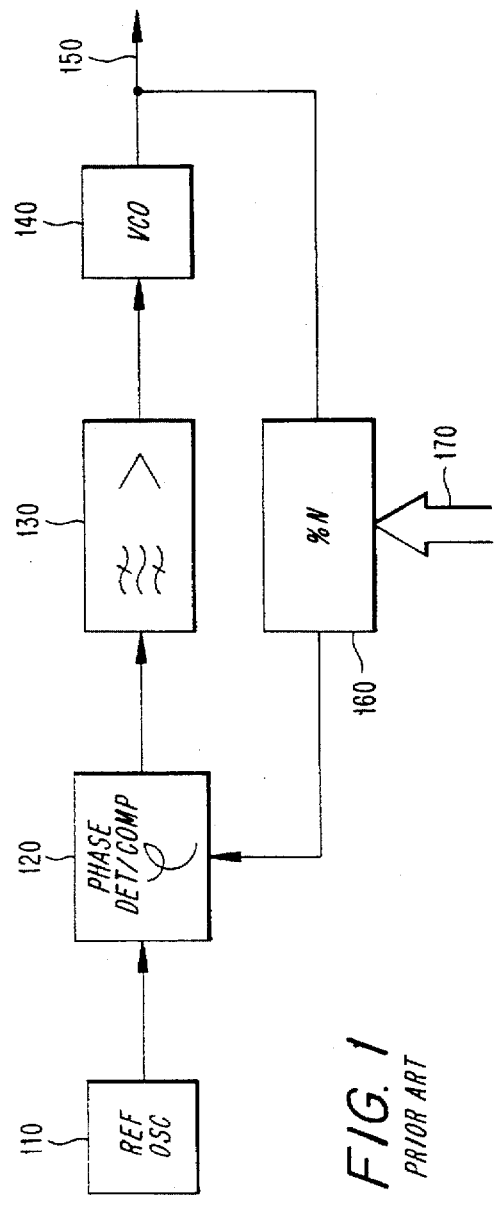
FIG. 1 shows a schematic block diagram of a known oscillator device comprising a phase-locked loop.

The most used method of phase-locking of a signal to a reference signal is shown in FIG. 1. The conventional phase-locked loop (PLL—Phase Locked Loop) basically consists of a reference oscillator 110, a phase detector/comparator 120, an amplifier and filter unit 130, a voltage-controlled oscillator 140 (VCO—Voltage Controlled Oscillator), and a variable or fixed frequency divider 160. By controlling 170 a variable frequency divider 160 and thereby dividing the output signal 150 by an arbitrary whole number, an output signal can be generated with an output frequency which is an arbitrary multiple of the frequency of the reference oscillator 110.

The output signal 150 from the voltage-controlled oscillator 140 (VCO) has a frequency which is an arbitrary whole number multiple higher than the frequency of the reference oscillator 110 and is dependent on the frequency division in the frequency divider 160. In the case where a non-whole number multiple of the reference oscillator's 110 frequency is desired, the frequency of the reference oscillator 110 can also be divided before the phase detector/comparator 120. The output signal 150 is frequency-divided with the frequency divider 160 (/N) down to a frequency which should be the same as the reference oscillator's 110 frequency. The frequency of the reference oscillator is then compared in the phase detector 120 with the frequency of the signal which has been divided. The phase detector 120 generates an output signal which, after filtering and amplification 130, controls the VCO 140. In the case where the frequencies/phases are not the same, the phase detector 120 will adjust its output signal in order for the VCO 140 to be able to compensate the output signal's frequency for this non-similarity. The phase detector's output signal is a value which corresponds to the frequency of the VCO's output signal 150 and is thus, normally, distinct from zero even though the phase-locked loop is phase-locked.

Since the conventional phase-locked loop (PLL) suffers from a few problems and faults such as phase noise (jitter) and a necessarily high amplification of the phase detector's output signal, as mentioned previously, a better and somewhat more complicated phase-locked loop is often used in applications having high requirements, namely the sampled phase locked loop (SPLL—Sampled Phase Locked Loop).

Figure 2:
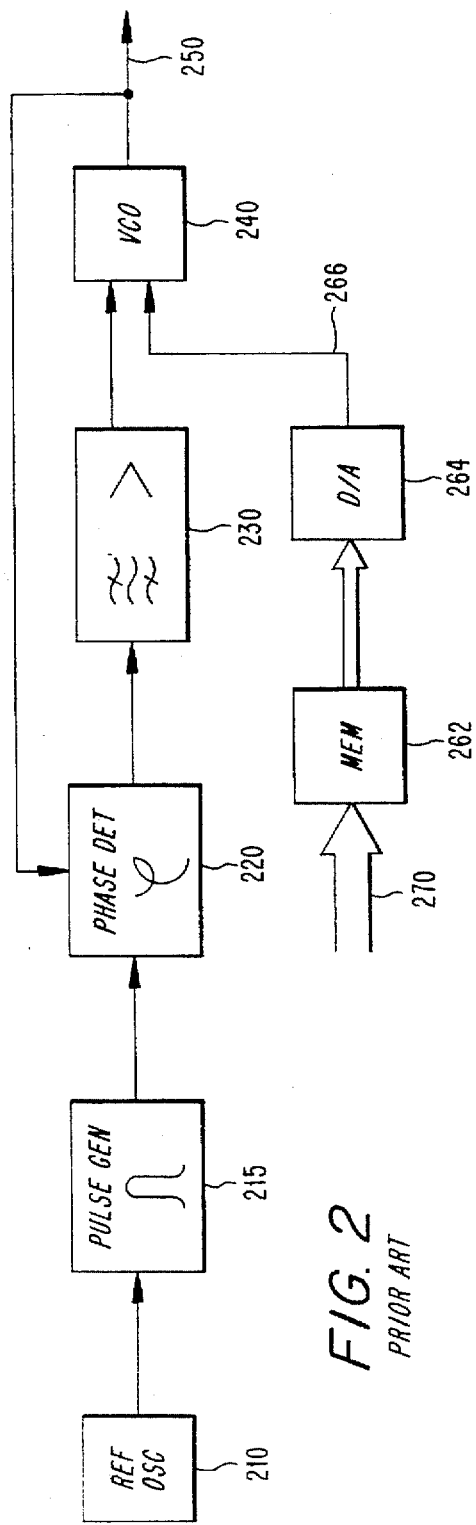
FIG. 2 shows a schematic block diagram of a known oscillator device comprising a sampled phase-locked loop with a memory for support voltages.

A sampled phase locked loop (SPLL), see FIG. 2, basically consists of a reference oscillator 210, a pulse generator 215, a phase detector 220, an amplification and filter unit 230, a voltage-controlled oscillator 240 (VCO) and a memory device which may suitably be a digital memory 262 and a digital/analog converter 264 (D/A-converter).

In the sampled loop, the VCO's envelope is sampled directly in the phase detector 220 with a quick pulse generated from the reference oscillator 210 and the pulse generator 215. The VCO 240 can phase-lock to all multiples of the reference frequency provided that the VCO is controlled so that the difference frequency out of the phase detector lies within the loop bandwidth.

The sampled phase detector has no discriminator part. This means that a difference frequency which is too large will result in the loop being unable to phase lock. In order to minimize the difference frequency, a support voltage 266 can be pre-set from a memory 262 via a D/A converter 264 to the VCO 240. This memory must contain support voltages for all selectable frequencies. The voltages will be measured and be continually updated and adjusted depending on, inter alia, the VCO's temperature drifts and ageing. At small frequency intervals the voltages will be close and it is thus difficult to obtain sufficient accuracy. As mentioned previously, error-locking on neighboring channels or on spurious signals commonly occurs.

The present invention has the object of overcoming the aforementioned problems and faults which are presented by conventional sampled phase locked loops (SPLL) and also sampled phase locked loops with more than one loop. The present invention is suitable for use, inter alia, in radio communications equipment, mobile telephony, the satellite field, radar equipment and microwave links for, inter alia, frequency synthesis on both the transmitting and receiving sides. The invention operates with frequencies in the microwave range, 1 GHz and upwards, as well as in other frequency ranges. In order to clarify the system according to the invention, some examples of its use will now be described in connection with FIGS. 3a-3c.

Figure 3A:
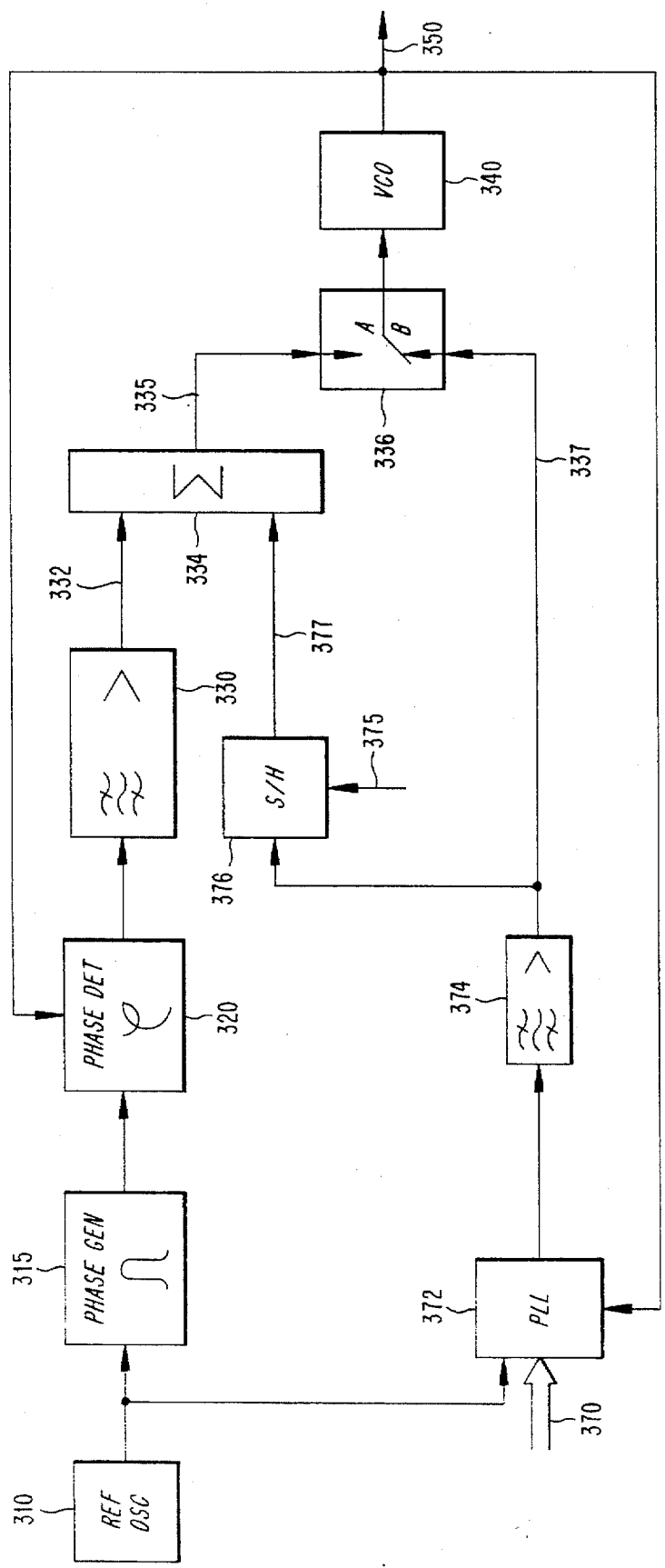
FIG. 3a shows a schematic block diagram of an embodiment of an oscillator device according to the present invention.
Figure 3B:
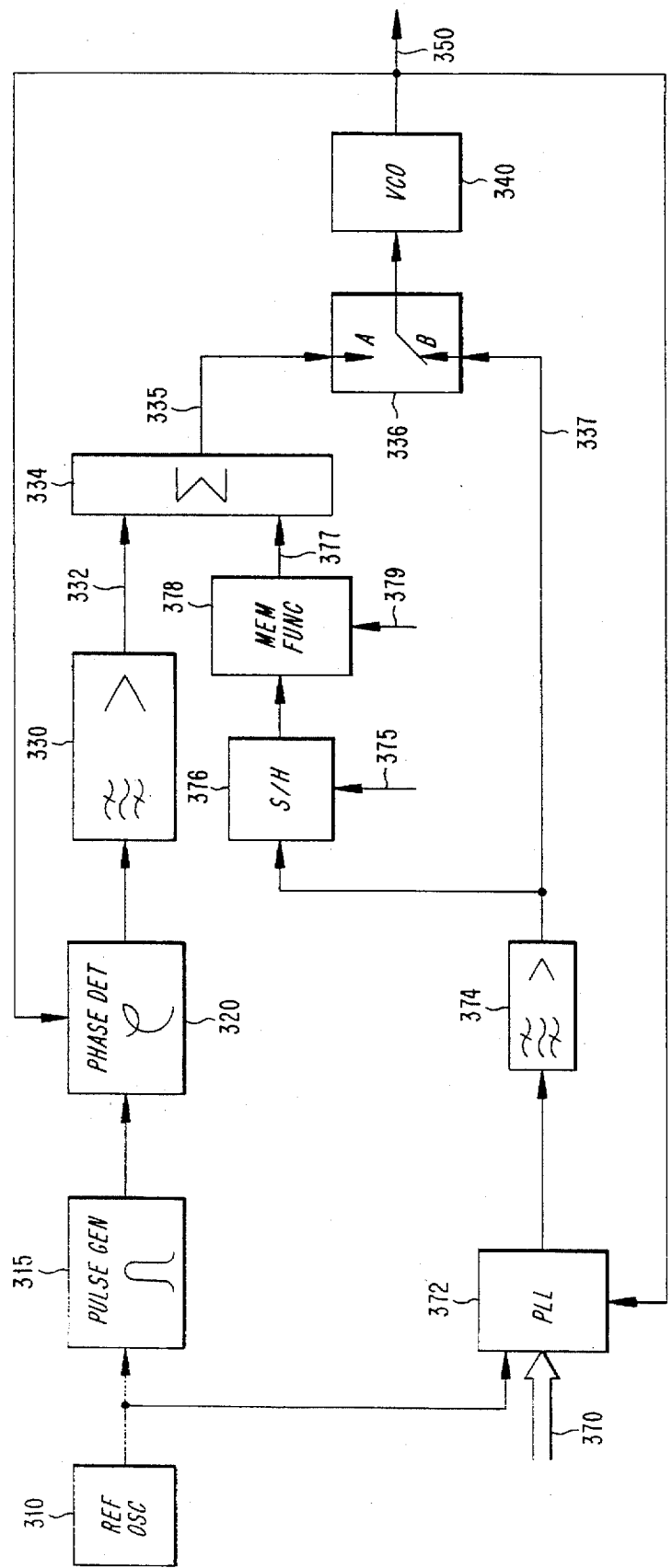
FIG. 3b shows a schematic block diagram of a further embodiment of an oscillator device according to the present invention.

FIG. 3a shows a block diagram of a basic embodiment of an oscillator device according to the present invention. This discloses the sampled phase-locked loop as a first loop which basically comprises a reference oscillator 310, a pulse generator 315, a phase detector 320, an amplifying and filter unit 330 which should contain at least one low-pass function which can be complemented with other filter functions (bandpass), and a controlled oscillator which is preferably a voltage-controlled oscillator 340 (VCO). Additionally included is a second loop which comprises a conventional phase-locked loop which is represented by a large block (PLL) 372 and an amplifying and filter unit 374 which should contain at least one low-pass function which can be complemented with other filter functions (bandpass). The large PLL-block 372 basically comprises adjustable frequency dividers which can be controlled by means of control signals 370 and a phase-frequency discriminator. The second loop has the voltage-controlled oscillator 340 in common with the first loop. In order that the two loops form complete loops according to the present invention, this basic embodiment of the invention also comprises a measuring and storage circuit 376 (Sample and Hold circuit, S/H), summation means 334 and switching means 336.

The first loop, the sampled phase locked loop (the SPPL-function), operates basically as a conventional sampled phase locked loop. The reference oscillator 310 together with the pulse generator 315 generates a fast pulse in order to be able to sample the envelope of the output signal 350 in the phase detector 320. The phase detector 320 produces an error signal 332 via the filtering and amplifying unit 330. The error signal 332 then controls in principal, not itself directly, the voltage-controlled oscillator 340 (the VCO) via the summation means 334 and the switching means 336 (placed in position A) in order to thereby give a sampled phase locked loop. The error signal 332 is generated in such a way that, when the first loop has phase-locked, a correct output signal 350 is generated.

The second loop (PLL-function) operates basically as a conventional phase locked loop. The output signal 350 from the voltage-controlled oscillator 340 is fed back to the PLL-block 372 where the output signal 350 is frequency-divided by means of some type of frequency-divider comprised within the PLL-block 372. There is suitably some type of variable frequency divider which can be controlled with control signals 370 in order to therefore be able to select the desired frequency of the output signal 350. In the PLL-block 372, the frequency divided output signal is then fed into a conventional phase-frequency discriminator in the PLL-block 372 in order that it can there be compared with a signal from a reference oscillator 310 which in this case is suitably the same reference oscillator which is included in the first loop. The result of the comparison in the phase-frequency discriminator is then fed via a filter and amplifying unit 374 in order to form a second control signal 337. The second control signal 337 then controls the voltage-controlled oscillator 340 (VCO) via the switching means 336 (placed in position B) in a way such that, when the second loop is phase-locked, a correct output signal 350 is formed.

During the setting procedure, the input of the VCO 340 is first coupled via the switching means 336, in position B, to amplifying and filter unit 374 in the second loop. The PLL-circuit which comprises a conventional phase-frequency discriminator, now phase-locks the VCO 340 to reference oscillator 310 which, in this embodiment, is also used as a reference oscillator to the second loop, which is preferable in most cases. After locking-in, the second control signal 337 is sampled to the VCO 340 in the measuring and storage circuit (S/H-circuit) 376 which produces a stored control signal 377 which is connected to the summation circuit 334. Suitably, a signal is used which indicates phase-locked as a sampling pulse.

After sampling of the second control signal, the switching means 336 switches to position A. The VCO 340 will maintain the same value in its control signal, but now as a first control signal 335 which comes from the summation circuit 334. The summation circuit 334 adds together the stored control signal 377 from the S/H circuit 376 with an error signal 332 which comes from the first loop, the sampled phase locked loop. The error signal 332 comes from the sampled phase detector 320 via the amplifying and filter circuit 330 and should in principle be zeroed, i.e. no active error signal. The first loop is also active during the setting procedure and the error signal 332 attempts to correct the frequency of the VCO 340 despite it not being coupled to the VCO 340. When the second loop has phase-locked and sampled the second control signal 337, this means that the error signal 332 does not have to correct the VCO 340 at that instant when the SPLL-function takes over the phase-locking, because the error signal 332 is summed in the summation means 334 with the stored control signal in order to produce the first control signal which then controls the VCO to generate an output signal 350 with correct frequency.

Cases may however arise where the error signal varies somewhat from a desired ideal value such as for example when the electrical conductor length from the reference oscillator 310 to the PLL-block 372 is not the same as the electrical conductor length from the reference oscillator 310 to the pulse generator 315. Symmetry in the electrical conductor lengths becomes more important the higher up in frequency the included components operate with. In such cases where the electrical conductor lengths vary somewhat, a phase difference between the first and the second loop will occur and upon switching from the second to the first loop, the VCO 340 will have to adjust its phase position via the first control signal 335.

The setting procedure with the PLL-function can occur in accordance with the description at each frequency change and calibration instance. The S/H-circuit 376 can also be complemented with a memory function 378 according to FIG. 3b where the control voltages can be stored for all of the occurring frequencies. The latter method gives a rapid frequency change via control signals 379.

It is also imaginable that the memory function be pre-programmed with control voltages for all desired frequencies, but it is most suitable probably to allow the setting procedure to program the memory function with control voltages. If the setting procedure programs the memory function, it is suitable to let each memory position in the memory function be coupled in some way to a flag or the like which provides an indication to whether the present memory position contains a valid, i.e. a programd, value or not. The programming can of course occur during "operation" and then a delay may occur before the memory function contains a complete set of control voltages/values, it being even imaginable that the memory function will never have a complete set.

By letting the setting procedure program the memory function, an automatic individual adaptation is achieved since the memory function is suitably zeroed/deleted from the start. In practice it is impossible to manufacture two identical oscillator devices, each oscillator being an individual one requiring its special control voltages and adjustments. On repairing or exchanging any part of the oscillator device, or as a result of any other act which will change the oscillator device's characteristics/sensitivity to different control signals, it is suitable to erase the memory function so that the memory function will be programd afresh during the setting procedure with new values for the repaired/altered oscillator device's characteristics/sensitivity.

If the voltage-controlled oscillator is subjected to temperature variations, it is advantageous to provide the memory function 378 with space for storing the values, sorted not only according to frequency but also according to temperature. In this case, the oscillator device should be provided with some type of temperature sensor so that correct values are both stored and retrieved from the memory function 378. Values can of course also be sorted into the memory function 378 based on other characteristics such as the characteristics of the oscillator device's surroundings, like the air humidity and air pressure for example. It can be suitable to store a time code with each value, the time code defining when the value was stored so as to be able to reach a decision in case an update with one or more setting procedures due to ageing of the oscillator device has to be carried out. The complexity and the number of different values and different conditions (temperature, air humidity) which are stored in the memory function 378 will be decided according to the environment to which the oscillator device is subjected/placed in, speed requirements for frequency changing, cost and absolute and operative working frequency ranges, etc.

The memory function 378 can be formed with the aid of a digital memory which, during storage of the measured values, is supplied via an analog to digital converter and, during retrieval, retrieves via a digital to analog converter. It is of course imaginable that the memory function is provided in another way or even with some type of analog memory of the CCD type (Charge Coupled Device) which makes analog to digital converters and digital to analog converters superfluous.

Figure 3C:
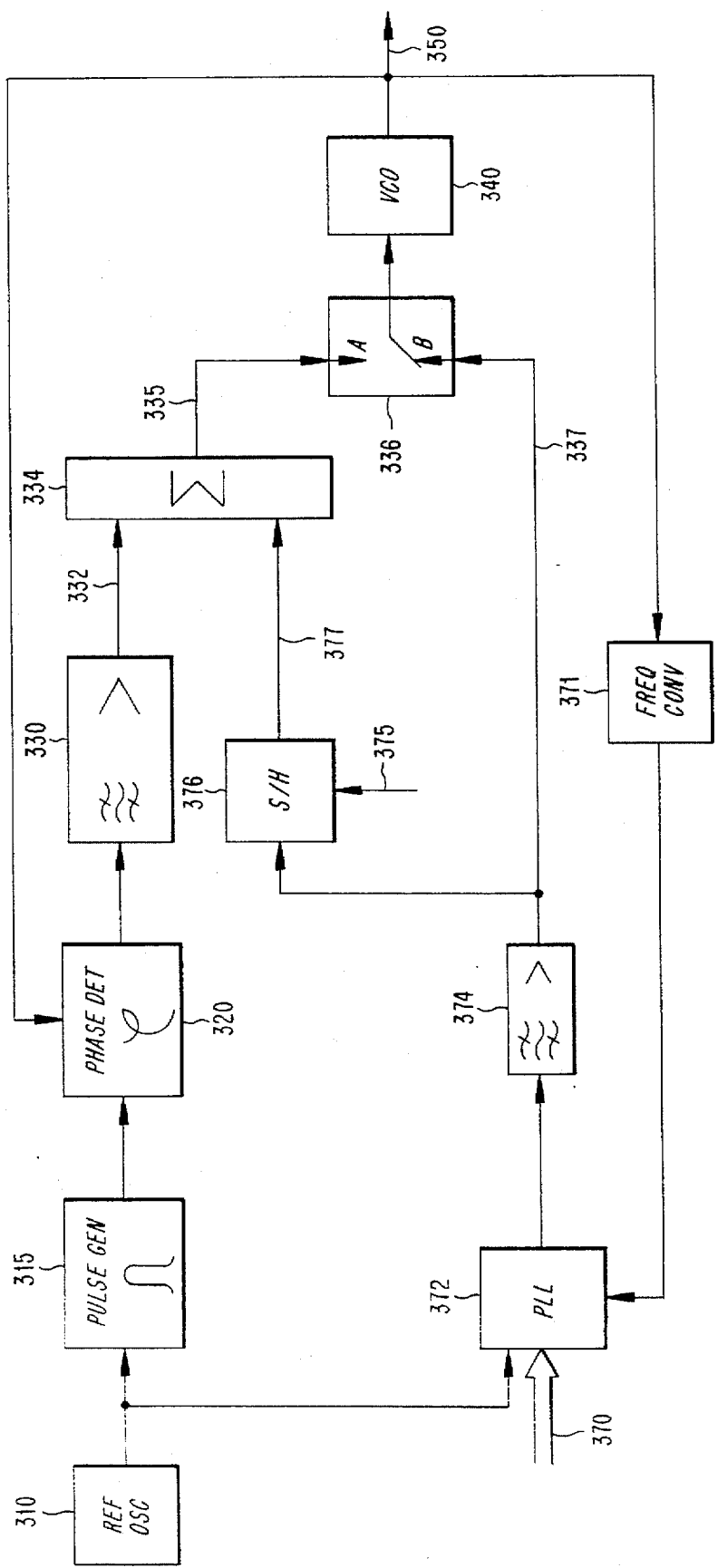
FIG. 3c shows a schematic block diagram of an additional embodiment of an oscillator device according to the present invention.

FIG. 3c shows an embodiment which makes use of a frequency conversion means 371 which frequency-converts the VCO's 340 output signal 350 before it is fed into the PLL-block 372 in the second loop. The frequency conversion is desirable in the case where the frequency of the output signal 350 is extremely high, for example within the microwave range or higher (1 GHz and upwards), otherwise particularly high requirements are put on the PLL-block 372 to also cope with frequencies of that order.

In one embodiment, the frequency conversion means 371 can for example comprise the frequency divider means which is arranged to frequency-divide the output signal 350, or in another embodiment it may comprise a mixer means which is arranged to mix down the output signal's 350 frequency. In order not to lose the phase position of the output signal, it is suitable, and in most cases necessary, to use a mixer signal which originates from the reference oscillator 310 for mixing down in the mixer means. Depending on the frequency range, it can also be necessary to frequency-multiply the reference oscillator's frequency in order to produce a mixer signal with a suitable frequency. The frequency multiplication can for example be performed with the aid of a phase locked loop, a sampled phase locked loop, or non-linear diodes.

The invention is not limited to the embodiments mentioned above, but can be varied within the scope of the appended claims.

What is claimed is:

1. Method of generating an output signal with one predetermined frequency at a time from a number of predetermined frequencies with a controlled oscillator, the method comprising the following steps:

arranging a first loop to operate as a sampled phase locked loop and, in the first loop:
  producing a first reference signal,
  comparing the phase of the output signal with the phase of the first reference signal,
  processing the result of the comparison in a first signal processor, and
  producing thereby an error signal, upon which a first control signal is dependent;

arranging a second loop to operate as a phase-locked loop and, in a setting procedure, determine the output signal's frequency, in the second loop:
  producing a second reference signal,
  frequency dividing the output signal,
  comparing the phase of the frequency-divided output signal with the phase of the second reference signal,
  processing the result of the comparison in a second signal processor, and
  producing thereby a second control signal, measuring the second control signal during the setting procedure and, when the second loop has phase-locked, storing the measured value to be sent on as a stored control signal;

summing the stored control signal with the error signal, thereby creating the first control signal;

producing the output signal by means of the controlled oscillator with a frequency which is in relation to the first or the second control signal; and coupling the second control signal to the controlled oscillator during the setting procedure and otherwise coupling the first control signal to the controlled oscillator.

2. Method according to claim 1, wherein the controlled oscillator is a voltage-controlled oscillator.

3. Method according to claim 1, wherein the processing in the first signal processor comprises filtering.

4. Method according to claim 3, wherein the processing in the second signal processor comprises filtering.

5. Method according to claim 4, wherein the filtering in the first signal processor is slower than the filtering in the second signal processor.

6. Method according to claim 1, wherein said predetermined frequencies lie within the microwave range or higher.

7. Method according to claim 1, wherein the measured value for each setting procedure is stored in a memory location corresponding to the predetermined frequency for the setting procedure in a memory unit, whereby changing of the output signal's frequency can occur without a setting procedure being coupled-in.

8. Method according to claim 7, wherein the memory location, in which the measured value is stored, also corresponds to at least one additional parameter.

9. Method according to claim 8, wherein the at least one additional parameter corresponds to at least one temperature parameter.

10. Method according to claim 1, wherein before the output signal is frequency-divided in the second loop, the output signal is frequency-converted so that the output signal's frequency will fall within the frequency range of the second loop.

11. Oscillator device for generating an output signal with one predetermined frequency at a time from a number of predetermined frequencies, said oscillator device comprising:

a first loop which comprises a reference oscillator, a pulse generator, a first phase comparator, and a first signal processing unit, wherein the first loop is arranged to operate as a sampled phase locked loop by comparing the phase of the output signal in the first phase comparator with the phase position of a first reference signal produced by the reference oscillator and the pulse generator and thereby, after a first signal-processing in the first signal processing unit, produce an error signal, upon which a first control signal is dependent;

a second loop which comprises a frequency divider, a second phase comparator and a second signal processing unit, wherein the second loop is arranged to determine the output signal's frequency by means of the frequency divider in the setting procedure by frequency-dividing the output signal in the frequency divider and comparing its phase in a phase comparator with the phase position of a second reference signal produced by the reference oscillator and thereby produce a second control signal after a second signal-processing in the second signal processing unit;

a controlled oscillator which is arranged to generate the output signal with a frequency which is in relation to the first or second control signal and to be a part of the first and the second loop;

switching means which are arranged to couple the first control signal or the second control signal to the controlled oscillator;

measuring and storage means arranged to measure and hold the value of the second control signal during the setting procedure when the second loop has phase-locked to a predetermined frequency in order thereby to produce a stored control signal; and summation means arranged to sum the stored control signal with the error signal in order thereby to produce the first control signal;

whereby the oscillator device is arranged, by means of the switching means, to couple the second control signal to the controlled oscillator during the setting procedure and otherwise to couple the first control signal to the controlled oscillator.

12. Oscillator device according to claim 11, wherein the controlled oscillator is a voltage-controlled oscillator.

13. Oscillator device according to claim 11, wherein said first signal processing unit in said first loop comprises a first amplifier and a first loop filter.

14. Oscillator device according to claim 13, wherein said second signal processing unit in said second loop comprises a second amplifier and a second loop filter.

15. Oscillator device according to claim 14, wherein said first loop filter is slower than said second loop filter.

16. Oscillator device according to claim 11, wherein said predetermined frequencies lie within the microwave range or higher.

17. Oscillator device according to claim 11, wherein said oscillator device also comprises memory means arranged to store the values of the second control signal measured during the setting procedure, in memory locations which are sorted with respect to frequency, and the stored control signal can also be produced from stored measured values in order thereby to allow a fast change of the output signal's frequency without having to go through a setting procedure.

18. Oscillator device according to claim 17, wherein the memory means are also arranged to arrange the measured values of the second control signal in memory positions sorted with respect to at least one parameter which belongs to the controlled oscillator at the instance of measuring, in order thereby to allow the maintaining of a stable and accurate frequency without having to go through a setting procedure upon variations of the controlled oscillator by the parameter(s), according to which the second control signal is sorted into memory locations.

19. Oscillator device according to claim 18, wherein the parameters which the controlled oscillator possesses at the instance of measuring, comprise the temperature belonging to the controlled oscillator for thereby allowing the maintaining of a stable and accurate frequency without having to go through a setting procedure upon temperature variations of the controlled oscillator.

20. Oscillator device according to claim 17, wherein the memory means comprises digital memory cells, an analog to digital converter, and a digital to analog converter, the memory means is arranged to store the measured values of the second control signal digitally in the digital memory cells after analog to digital conversion in the analog to digital converter, and upon the production of the stored control signal from stored measured values, the measured values which are digitally stored in the digital memory units are digital to analog converted.

21. Oscillator device according to claim 17, wherein the memory means comprises analog memory cells arranged to store the measured values of the second control signal in analog form and, when producing the stored control signal from the stored measured values, these are supplied from the analog memory cells.

22. Oscillator device according to claim 11, wherein said oscillator device comprises frequency conversion means arranged to frequency-convert the output signal before it is frequency-divided in the second loop, in order that the output signal's frequency will fall within the second loop's frequency range.

23. Oscillator device according to claim 22, wherein said frequency conversion means comprises frequency divider means which is arranged to frequency-convert the output signal before it is frequency-divided in the second loop.

24. Oscillator device according to claim 22, wherein said frequency conversion means comprises mixer means which is arranged to mix down the output signal's frequency before it is frequency-divided in the second loop.

25. Oscillator system for generating an output signal with one predetermined frequency at a time from a number of predetermined frequencies, said oscillator system comprising:

a first loop which comprises a reference oscillator, a pulse generator, a first phase comparator, and a first signal processing unit which comprises an amplifier and a first loop filter, wherein the first loop is arranged to operate as a sampled phase locked loop by comparing said output signal's phase, in the first phase comparator, with the phase of a first reference signal produced by the reference oscillator and the pulse generator and thereby produce, after a first signal-processing in the first signal processing unit, an error signal upon which a first control signal is dependent;

a second loop which comprises a frequency conversion means, a frequency divider, a second phase comparator and a second signal processing unit which comprises a second amplifier and a second loop filter, wherein the second loop is arranged to frequency-convert the output signal by means of the frequency conversion means in order that the frequency of the output signal will fall within the second loop's frequency range, and by means of the frequency divider during a setting procedure, determine the frequency of the output signal by frequency-dividing the frequency-converted output signal in the frequency divider and compare its phase in the second phase comparator with the phase of a second reference signal produced by a reference oscillator and thereby produce a second control signal after a second signal-processing in the second signal processing unit;

a voltage-controlled oscillator which is arranged to generate the output signal with a frequency which is in relation to the first or second control signal, and is arranged to be a part of the first and the second loop;

switching means which is arranged to couple the first control signal or the second control signal to the voltage-controlled oscillator;

measuring and storage means arranged, during the setting procedure, to measure and hold the voltage value of the second control signal when the second loop has phase-locked to a predetermined frequency, in order thereby to produce a stored control signal;

memory means arranged to store the voltage values of the second control signal measured during the setting procedure, in memory locations which are at least sorted with respect to frequency and in that the stored control signal can also be produced from stored measured voltage values, in order thereby to allow a fast change of the output signal's frequency without having to go through a setting procedure; and summation means arranged to sum the stored control signal with the error signal in order thereby to produce the first control signal;

wherein the oscillator system is arranged, by means of the switching means, to couple the second control signal to the voltage-controlled oscillator during the setting procedure and otherwise to couple the first control signal to the voltage-controlled oscillator and wherein the first loop filter is slower than the second loop filter.

26. Oscillator device for generating an output signal with one predetermined frequency at a time from a number of predetermined frequencies, said oscillator device comprising:

a first loop which is arranged to operate as a sampled phase locked loop and thereby produce an error signal, upon which a first control signal is dependent;

a second loop which is arranged to operate as a phase locked loop and to produce a second control signal;

a voltage-controlled oscillator which is arranged to generate the output signal with a frequency which is in relation to the first or second control signal, and is arranged to be a part of the first and second control loop;

switching means which is arranged to couple the first control signal or the second control signal to the voltage-controlled oscillator;

measuring and storage means arranged, during a setting procedure, to measure and hold the voltage value of the second control signal when the second loop has phase-locked to a predetermined frequency, in order thereby to produce a stored control signal; and summation means arranged to sum the stored control signal with the error signal in order thereby to produce the first control signal;

whereby the oscillator device is arranged, via the switching means, to couple the second control signal to the voltage-controlled oscillator during the setting procedure and otherwise to couple the first control signal to the voltage-controlled oscillator.

* * * * *